United States Patent [19]

Ishikawa et al.

[11] Patent Number: 5,616,962
[45] Date of Patent: Apr. 1, 1997

[54] SEMICONDUCTOR INTEGRATED CIRCUIT DEVICES HAVING PARTICULAR TERMINAL GEOMETRY

[75] Inventors: Toshimitsu Ishikawa, Kawaguchi; Atsushi Kitamura, Tokyo; Kenji Hirayama, Ooita, all of Japan

[73] Assignee: Kabushiki Kaisha Toshiba, Kawasaki, Japan

[21] Appl. No.: 348,128

[22] Filed: Nov. 28, 1994

Related U.S. Application Data

[62] Division of Ser. No. 7,877, Jan. 22, 1993, abandoned.

[30] Foreign Application Priority Data

Jan. 24, 1992 [JP] Japan ........................... 4-10441

[51] Int. Cl.[6] ........................... H01L 23/28; H01L 23/50
[52] U.S. Cl. ........................... 257/777; 257/686; 257/685
[58] Field of Search ........................... 257/777, 686, 257/685, 684

[56] References Cited

U.S. PATENT DOCUMENTS

| | | | |
|---|---|---|---|
| 3,184,882 | 5/1965 | Vega . | |
| 3,594,689 | 7/1971 | Hopt | 361/735 |
| 4,017,963 | 4/1977 | Beyerlein | 257/686 |
| 4,045,105 | 8/1977 | Lee et al. | 439/69 |
| 4,080,026 | 3/1978 | Gianni | 257/686 |
| 4,224,637 | 9/1980 | Hargis | 257/686 |
| 4,426,689 | 1/1984 | Henle et al. | 361/749 |
| 4,661,886 | 4/1987 | Nelson et al. | 257/729 |
| 4,764,846 | 8/1988 | Go | 361/708 |
| 4,855,809 | 8/1989 | Malhi et al. | 257/684 |
| 4,894,706 | 1/1990 | Sato et al. | 257/686 |
| 4,975,763 | 12/1990 | Baudouin et al. | 257/696 |
| 5,065,277 | 11/1991 | Davidson | 257/686 |
| 5,086,018 | 2/1992 | Conru et al. | 257/702 |
| 5,107,586 | 4/1992 | Eichelberger et al. | 437/208 |
| 5,198,888 | 3/1993 | Sugano et al. | 257/686 |
| 5,239,447 | 8/1993 | Coturs et al. | 257/686 |

FOREIGN PATENT DOCUMENTS

| | | |
|---|---|---|
| 58-178547 | 10/1983 | Japan . |
| 62-293749 | 12/1987 | Japan . |
| 63-186457 | 8/1988 | Japan . |
| 2239651 | 9/1990 | Japan . |

OTHER PUBLICATIONS

"Batch Fabricated Three Dimensional . . . Systems," EEE Transactions On Computers, vol. C-20, No. 5 (May 1971), Howard L. Parks.

Primary Examiner—Sara W. Crane
Assistant Examiner—Alexander Oscar Williams
Attorney, Agent, or Firm—Finnegan, Henderson, Farabow, Garrett & Dunner, L.L.P.

[57] ABSTRACT

A method of mounting semiconductor integrated circuit devices comprising steps of forming a semiconductor device block having a plurality of semiconductor integrated circuit devices of vertical mounting type coupled to each other in parallel, and mounting the semiconductor device block on a printed board. A block of semiconductor integrated circuit devices comprising a plurality of semiconductor integrated circuit devices of vertical mounting type, and coupling means for coupling the plurality of semiconductor integrated circuit devices each other in parallel.

8 Claims, 9 Drawing Sheets

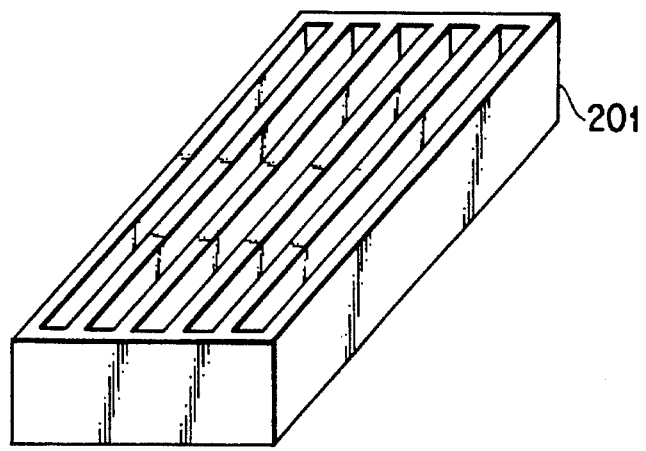
F I G. 4
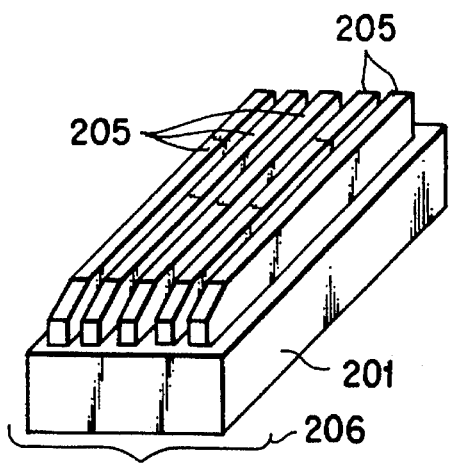
F I G. 5
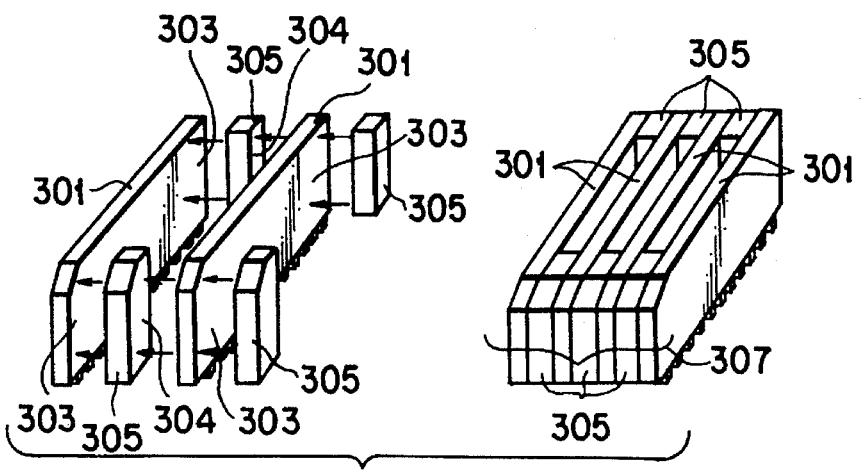
F I G. 6

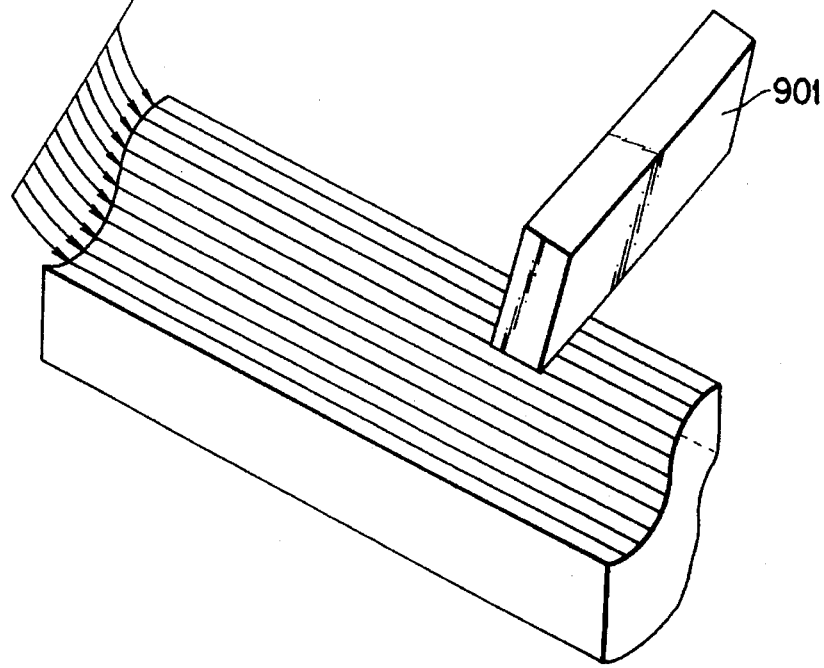
F I G. 23

SEMICONDUCTOR INTEGRATED CIRCUIT DEVICES HAVING PARTICULAR TERMINAL GEOMETRY

This is a division of application Ser. No. 08/007,877, filed Jan. 22, 1993, now abandoned.

BACKGROUND OF THE INVENTION

1. Field of the Invention

The present invention relates to a semiconductor device and its mounting method and, more particularly to a semiconductor integrated circuit device of vertical surface mounting type.

2. Description of the Related Art

High mounting density is required in mounting a semiconductor device, particularly an integrated circuit such as a memory, onto a printed board. To satisfy this requirement, the method for mounting the semiconductors has been changed from an insertion mounting to a surface mounting. As a result, there is no need that an insertion hole is formed in the printed board, and mounting density can be improved. Regarding the surface mounting, the so-called soldering reflow in which electric parts fixed to the printed board are passed through a heating furnace has been used. If reflow is used in the surface mounting of the semiconductor integrated circuit device of a multiple pin package, a lead pitch can be reduced, and higher packaging density can be obtained.

Moreover, regarding the package of the semiconductor such as a memory, a horizontal package represented by a conventional dual in-line package (DIP) is changed to a vertical package represented by a zig-zag in-line package (ZIP). As a result, the number of the semiconductor devices to be mounted per unit area of the printed board can be increased, and high density mounting can be made.

The electronic parts for surface mounting are structured not to fall down even if soldering is melted when reflow is performed. However, as shown in FIG. 20, in a case that a semiconductor device 901 of vertical mounting type is mounted on a printed board 903 via outer lead 904 extending vertically from the lower side of the body of semiconductor device 901, the center of gravity of the semiconductor device becomes high, and use of only soldering paste 905 even in an extended blob as shown in the side view of FIG. 20, provides insufficient force for fixing the semiconductor device. Moreover, since the semiconductor device of vertical mounting type is not structured to stand itself, the semiconductor device falls down if soldering melts when reflow is performed. Therefore, in mounting the semiconductor device of vertical mounting type on the printed board, it is difficult to use the surface mounting by reflow.

There have been proposed several methods for surface mounting the semiconductor device of vertical mounting type. For example, as shown in FIG. 21, an L-shaped outer lead 907 is made long in a plane direction of the printed board, and even the semiconductor device of vertical mounting type can stand itself. However, since the length of the outer lead 907 becomes longer, a printed wiring pattern 908 of the substrate surface is detoured around its course by the lead 907, which is extended right and left, as shown in the figure. As a result, the printed wiring pattern 908 of the substrate surface is complicated and enlarged. Moreover, the complication of pattern design, the rise of the manufacturing cost, and the enlargement of the substrate area are brought about. For the above reasons, such a printed wiring pattern 908 is insufficient for high packaging density. Furthermore, the broken lines of the both side portions have no relation with the circuit of the inner portion of the semiconductor integrated circuit device, and the arrangement of these lines only means that the lead line 907 for mounting the device on the substrate is avoided. This brings about the enlargement of the semiconductor integrated circuit device.

As shown in FIG. 22, a projection 909, which is longer than the length of the L-shaped outer lead 904 in the vertical direction, is formed on both sides of the package in a case that resin-sealing is performed. In this case, the semiconductor device is fixed as vertically standing till soldering is hardened. Due to this, since at least two through holes 911 per one semiconductor device must be formed in the printed board 903, mounting efficiency is lowered. Moreover, in the case that both-side mounting or multi-layer mounting circuit is used, there is a problem in that a circuit pattern must be enlarged so as to detour the front and back through holes 911. Furthermore, since material of the mounting substrate is different from that of sealing resin when reflow is performed, there is a problem in that a crack is generated in the mounting substrate. These problems cannot be solved even if the material of the projection is changed from epoxy resin to Fe-Ni, which is the same material as the lead frame.

As mentioned above, if the semiconductor device of vertical mounting type is surface mounted, there is a problem in that high density mounting, which is an object of surface mounting, cannot be realized.

SUMMARY OF THE INVENTION

An object of the present invention is to provide a method for surface-mounting a plurality of semiconductor integrated circuits of vertical mounting type onto a substrate with high density, and semiconductor integrated circuit devices to be used in this method.

The present invention provides a method of mounting semiconductor integrated circuit devices comprising steps of forming a semiconductor device block having a plurality of semiconductor integrated circuit devices of vertical mounting type coupled to each other in parallel, and mounting the semiconductor device block on a printed board. Moreover, the present invention provides a block of semiconductor integrated circuit devices comprising a plurality of semiconductor integrated circuit devices of vertical mounting type, and coupling means for coupling the plurality of semiconductor integrated circuit devices each other in parallel.

The object of the present invention can be attained by the above-mentioned method. That is, unlike the prior art, the manufacturing method of the present invention does not use terminals for inserting the semiconductor device into the printed board or L-shaped fittings in order to mount the plurality of semiconductor integrated circuit devices on the printed board. The manufacturing method of the present invention comprises a step of coupling the plurality of semiconductor devices to each other in parallel. Thereby, the plurality of semiconductor devices are shaped in a block form, and wiring terminals are arranged in a matrix manner. Therefore, in a case that reflow is performed and soldering is performed, the block is stabilized and does not fall down.

Therefore, the semiconductor integrated circuit devices can be mounted on the printed board with high density in order to make it possible to perform stabilized soldering without using special terminals and fittings.

Also, the block of the semiconductor integrated circuit devices can be mounted on the printed board with high density without using special terminals and fittings by providing means for coupling the semiconductor integrated circuit devices to each other.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 4 and 5 are perspective views showing a second embodiment of the present invention;

FIGS. 6, 7 and 8 are perspective views showing a third embodiment of the present invention;

FIG. 23 is a perspective view showing a part of a multi-layered wiring substrate of the embodiment of the present invention.

DETAILED DESCRIPTION OF THE PREFERRED EMBODIMENTS

An embodiment of the present invention showing that the semiconductor device of vertical mounting type using the present invention will be explained with reference to FIGS. 1 to 3.

Figure 1:
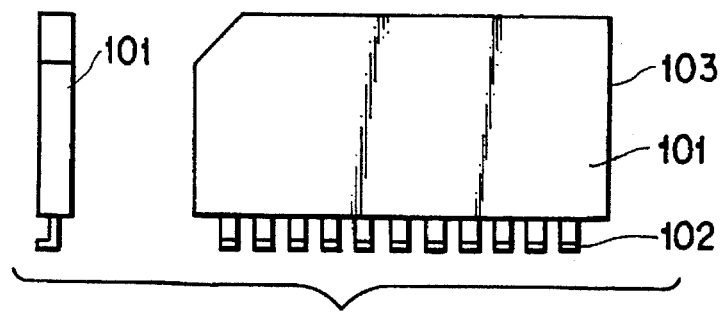
FIGS. 1 and 2 are a front view and a side view each showing a first embodiment of the present invention.

In the first embodiment, a semiconductor device 103 of vertical mounting type shown in FIG. 1 is mounted on a printed board. A package 101 in which a semiconductor chip is molded from epoxy resin is the same as ZIP. An outer lead 102 is electrically connected to the inner semiconductor chip, and its top end is curved in an L-shape form so as to make it possible to perform surface-mounting. The stability of the semiconductor device 103 is worse as it is. Even if the semiconductor device 103 is fixed to the printed board by soldering paste having adhesion, the semiconductor device 103 falls down since paste is melted when reflow is performed.

Figure 2:
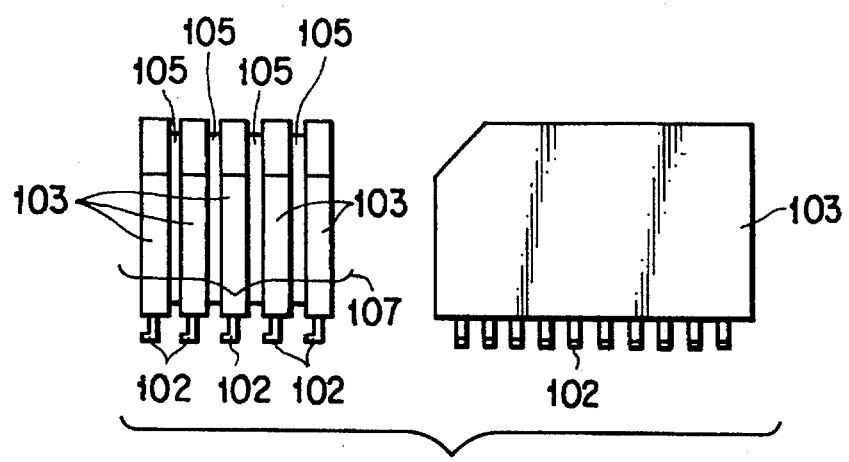

As shown in FIG. 2, a plurality of semiconductor devices 103 and adhesives 105 are coupled to each other in parallel, so that a semiconductor device block 107 is formed. The semiconductor device block 107 comprising the plurality of semiconductor devices 103 stands itself.

Figure 3:
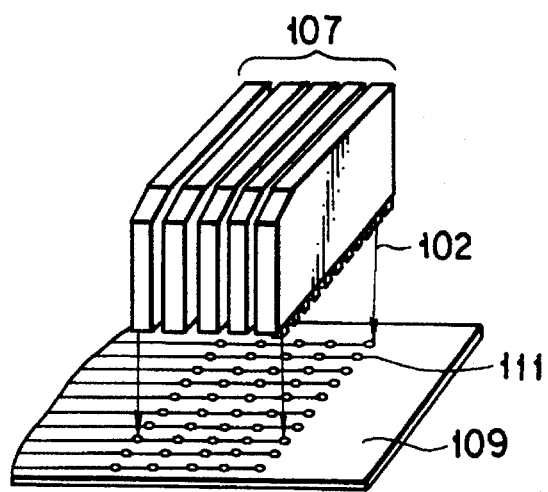
FIG. 3 is a perspective view showing the first embodiment of the present invention.

As shown in FIG. 3, the semiconductor block 107 is mounted on a printed board 111 in which paste is printed at a predetermined position. Sequentially, reflow is performed by hot air and soldering paste is melted, so that the outer lead 102 and the printed board 111 are soldered. Since the semiconductor device block 107 stands itself, the semiconductor device block 107 does not fall down even if soldering paste having adhesion is melted when reflow is performed.

The first embodiment was explained above, the present invention is not limited to the method in which soldering paste is printed and melted by hot air. It is possible to perform the surface mounting by use of vapor phase reflow.

If the method shown in the first embodiment is used, the semiconductor device of vertical mounting type can be surface-mounted on the printed board without forming any through holes.

In the first embodiment, the semiconductor device block was formed by use of the adhesive. It is possible to use a frame in which the semiconductor device can be contained. The following will explain a second embodiment using such a frame with reference to FIGS. 4 to 5.

As shown in FIG. 4, there is prepared a frame 201 formed of heat resistance which can contain a plurality of semiconductor devices. As shown in FIG. 5, semiconductor devices 205 are fixed to the frame and a semiconductor device block 206 is formed. The following processes may be performed by surface-mounting by use of reflow as shown in FIG. 3. After finishing the surface mounting, the frame 201 is detached.

The frame 201 is made of epoxy resin or metal. As shown in FIG. 4, it is not limited that the lower half of the semiconductor devices is enclosed, and the entire of the semiconductor devices may be enclosed with the frame. Moreover, a leg passing through the printed board may be formed in the frame. In the case that the frame is detached in the first and second embodiments, heat, which is generated at the time of the operation of the semiconductor devices, cannot be efficiently emitted. Since the surface area of the semiconductor device block is enlarged if a space is formed when the semiconductor devices are coupled to each other, sufficient heat emission efficiency is expected. However, "the space is formed and the semiconductor devices are coupled to each other" in the specification means that a spacer is provided between the semiconductor devices, thereby the semiconductor devices are coupled to each other. The following will explain a third embodiment with reference to FIGS. 6 to 8.

FIG. 6 shows that spacers 305 are provided between semiconductor devices 301 when the semiconductor devices 305 are coupled to each other. An adhesive is applied to both end portions 303 of the semiconductor devices 301 and plane portions 304 of the spacers 305, so that the semiconductor devices 301 and the spacers 305 are adhered. Sequentially, the above-formed semiconductor device block 307 is surface-mounted by use of reflow similar to the first embodiment.

Since the surface area of the semiconductor device block is enlarged, heat, which is generated at the time of the operation of the semiconductor devices, cannot be efficiently emitted.

Figure 7:
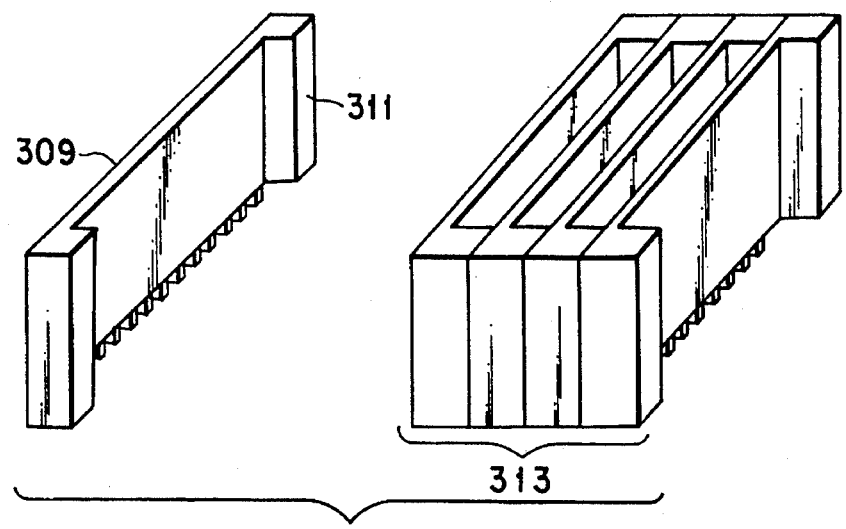

In the third embodiment, the spacers 305 were post-adhered to the semiconductor devices 301. However, as shown in FIG. 7, a protrusion portion 311 corresponding to the spacer may be integrally formed when a semiconductor device 309 is molded by epoxy resin. If the protrusion portion 311 is formed as mentioned above, a process in which a semiconductor device block 313 is formed can be simplified.

Figure 8:
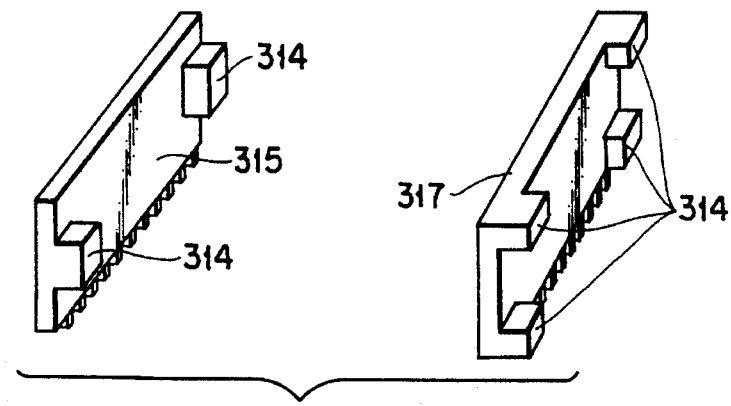

In the embodiment shown in FIGS. 6 and 7, the spacers were arranged in both ends of the semiconductor devices. However, the spacers or the protrusion portions may be made small in order to efficiently emit heat. FIG. 8 shows that semiconductor devices 315 and 317 in which small protrusion portions 314 are integrally formed.

Figure 9:
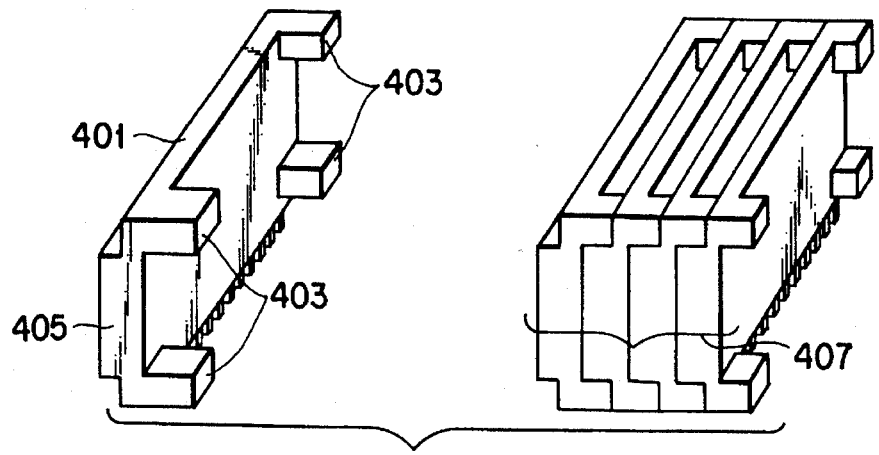
FIGS. 9 and 10 are perspective views showing a fourth embodiment of the present invention.

The above explained mainly the method for forming the semiconductor device block by use of the adhesive. FIG. 9 shows a fourth embodiment in which cavity and protrusion portions are formed in the semiconductor devices and these portions are inserted therein.

Two projections 403 corresponding to the concave portions are formed in the surface of a semiconductor device 401, and a projection 405 corresponding to the protrusion portion is formed in the rear surface. The space between projections 403 is set to be the same as the width of the projection 405, and the cavity portions and the protrusion portion are engaged with each other. As a result, a semiconductor device block 407 can be formed without using an adhesive, and the process can be simplified as compared with the previous embodiments.

Figure 10:
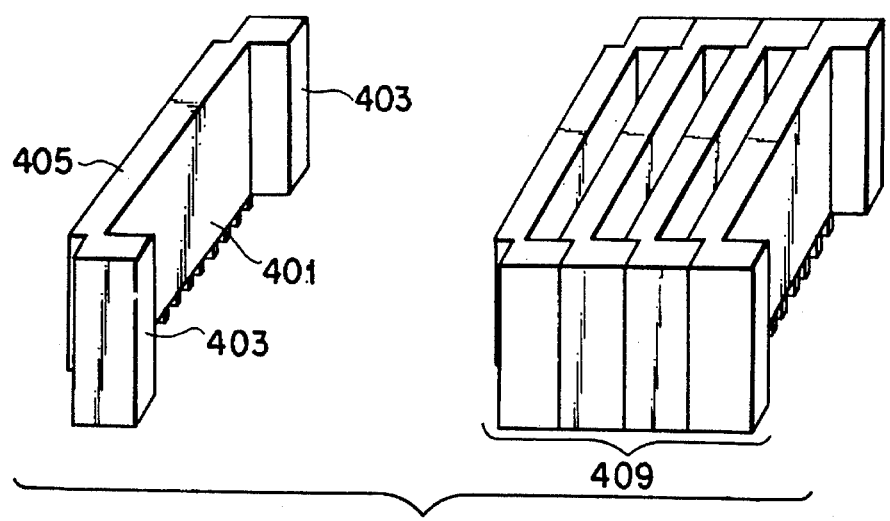

FIG. 10 shows a fifth embodiment in which the fourth embodiment is a little modified and the direction where the cavity and protrusion portions are formed is changed. According to the fifth embodiment, even if there is found a defective semiconductor in an inspection process after mounting, only a part of the semiconductor devices in the semiconductor device block 409 is pulled, thereby making it possible to replace the detective semiconductor device with a new one.

Figure 11:
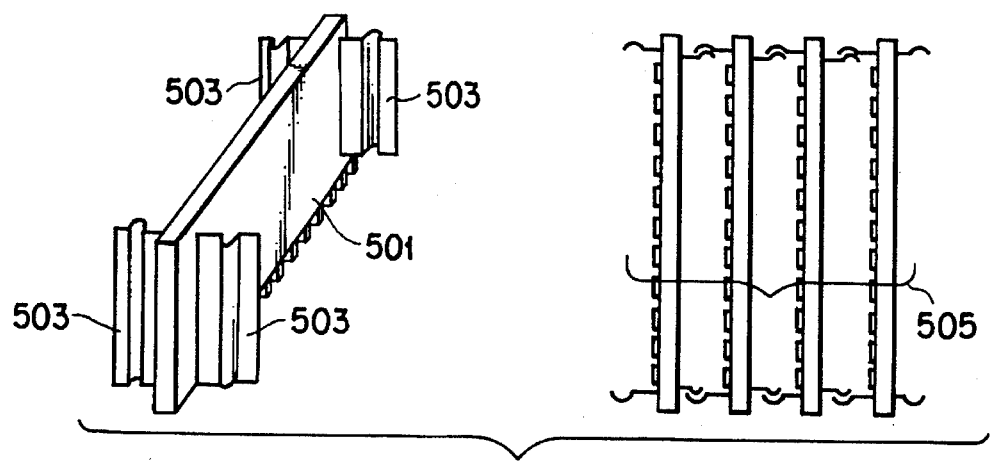
FIG. 11 is a perspective view showing a fifth embodiment of the present invention.

Moreover, as shown in FIG. 11, couplers 503, which are formed of metal, may be used as coupling means in place of the cavity and protrusion portions formed in the surface of the semiconductor device. In this case, the couplers bend like a spring, and are coupled to a semiconductor device 501. The shapes of the couplers are not limited to the shapes shown in FIG. 11. Any shapes, which can firmly couple to the semiconductor device, may be used. There is not need that the number of processes is particularly increased if the couplers 503 are simultaneously formed in the lead frame when the outer lead is formed.

Figure 12:
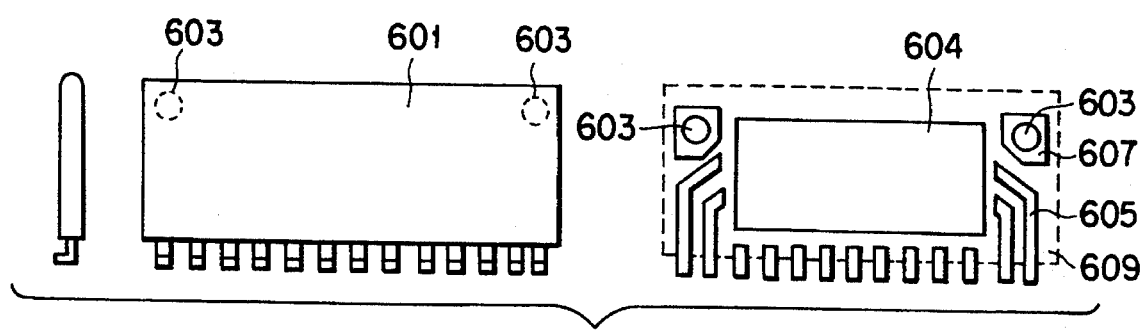
FIG. 12 is a front and side views showing a sixth embodiment of the present invention.
Figure 13:
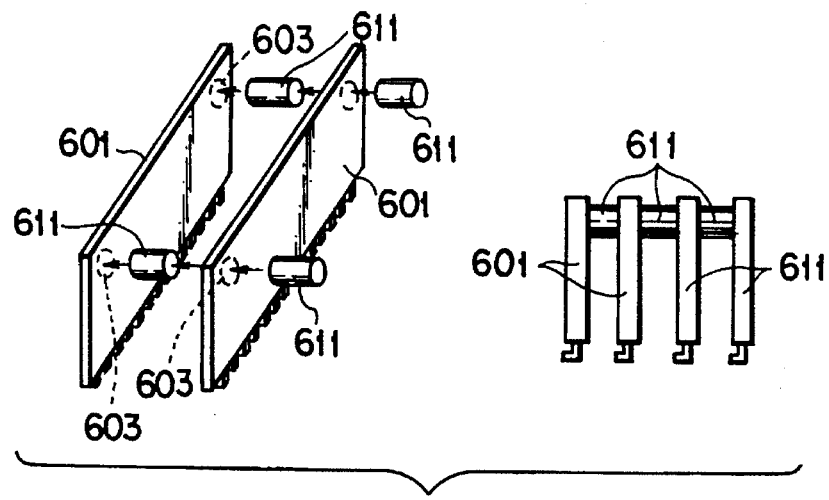
FIG. 13 is a perspective view showing the sixth embodiment of the present invention.
Figure 14:
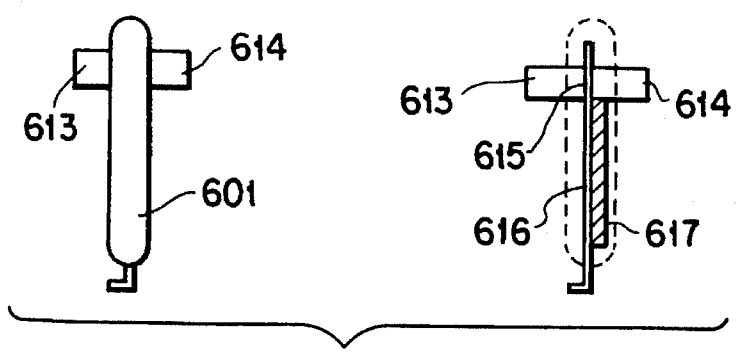
FIG. 14 is a side view showing the sixth embodiment of the present invention.

FIGS. 12 to 14 show a sixth embodiment using a magnet as coupling means for the semiconductor devices.

As shown in FIG. 12, a magnet 603 is buried in a semiconductor device 601. By use of attraction of the magnet, a semiconductor device block is formed. The magnet is mounted on the lead frame when the outer lead is formed. A magnet bed 607 for mounting the magnet is formed in the lead frame in advance. If the area of the magnet bed is enlarged, the area of the magnetic pole of the magnet is increased, attraction is increased. If a magnet, which is too strong, is used as magnet 603, this may have an unfavorable influence on the semiconductor device. The method by use of increase in the area of the magnet bed 607 can increase attraction of the magnet without increasing damage to the semiconductor device due to a magnetic field.

FIG. 13 show the mounting method of the semiconductor device 601 having magnet 603. The portions where the magnets 603 of the semiconductor devices 601 are buried are coupled to each other through spacers 611 of a strong magnetic member. In a case that a mounting space is not large, there is no need that the spacers are strong magnetic members. In a case that the semiconductor devices 601 are closely mounted, no spacer 611 is needed.

As shown in FIG. 14, magnets 613 and 614 may be exposed from the semiconductor device 601. The manufacturing method is that two magnets are mounted on both surfaces of a magnet bed 615. According to the above-mentioned manner, no spacer may be used in a case that the mounting space is formed. Moreover, since two magnets are coupled to each other, sufficient coupling force can be ensured even if a strong magnet is not used. Moreover, since leakage of the magnetic field is little, an unfavorable influence is little exerted on the semiconductor device.

In FIG. 14, there was shown an example in which two magnets were formed and exposed on the front and rear surfaces of the semiconductor device. However, the magnets may be exposed on only the front surface or the rear surface.

Also, the strong magnetic member, which is in contact with the magnet of the inside, may be exposed in place of the magnet.

In a case where the semiconductor device is exposed as shown in FIG. 14, a protrusion portion, which corresponds to the spacer, and which has the same height as the exposed magnet, may be formed at a different position of the surface. Thereby, the semiconductor device block is stabilized.

The position where the magnet is provided is not limited to the position shown in FIGS. 12 to 14. Any positions may be allowed if the magnets can be mounted, the semiconductor devices can be stably coupled to each other.

FIGS. 15 to 18 explain a seventh embodiment in which holes, serving as coupling means of the semiconductor devices, are formed in the semiconductor devices and a coupling shaft is passed through the holes, so that a semiconductor device block is formed.

Figure 15:
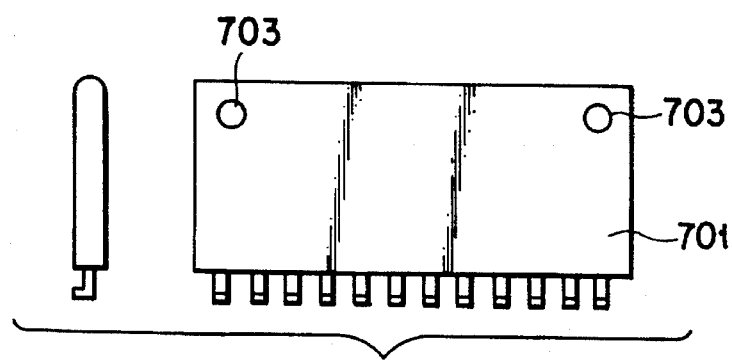
FIG. 15 is a front and side views showing a seventh embodiment of the present invention.
Figure 16:
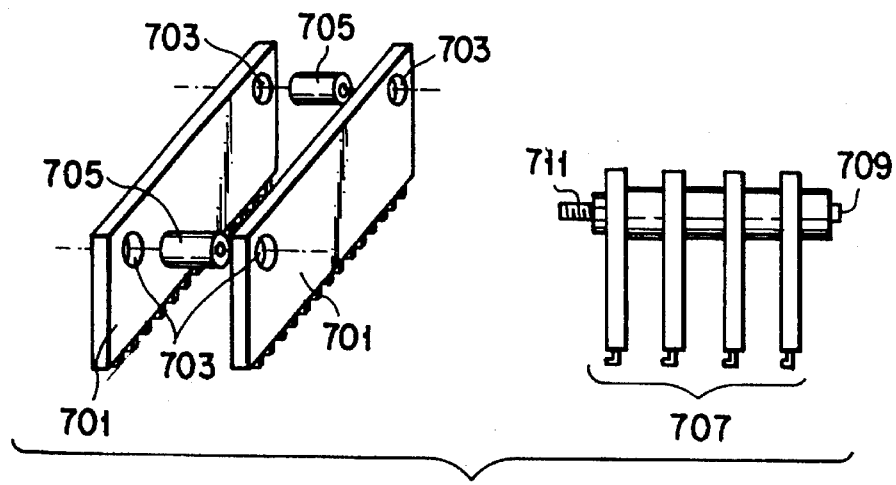
FIG. 16 is a perspective view showing the seventh embodiment of the present invention.

As shown in FIG. 15, coupling holes 703 are formed in a semiconductor device 701. As shown in FIG. 16, spacers 705 are coupled to the semiconductor devices through the spacers 705 by use of a coupling shaft, thereby a semiconductor device block 707 is formed. As a coupling shaft, a shaft in which a bolt 709 and a nut 711 may be combined, or a piano wire may be used.

In the seventh embodiment, the coupling shaft may be detached after surface-mounting.

Also, in a case that a closely mounting is performed, there is no need to say that no spacer is used.

Figure 17:
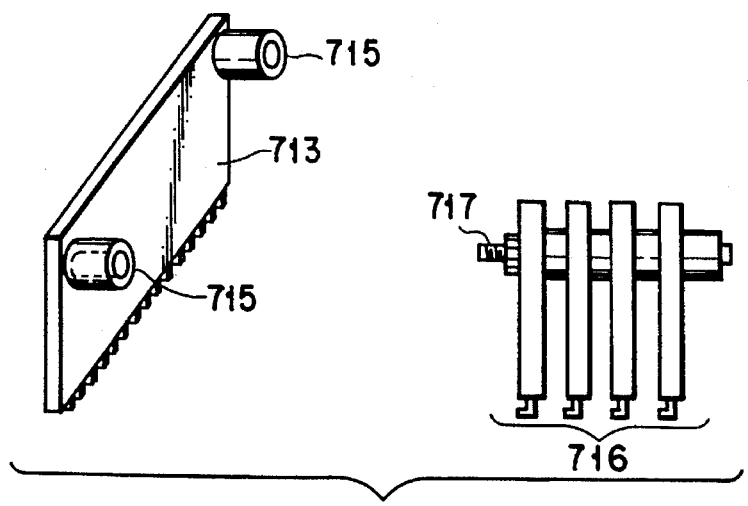
FIGS. 17 and 18 are a perspective view and a side view showing the seventh embodiment of the present invention.
Figure 18:
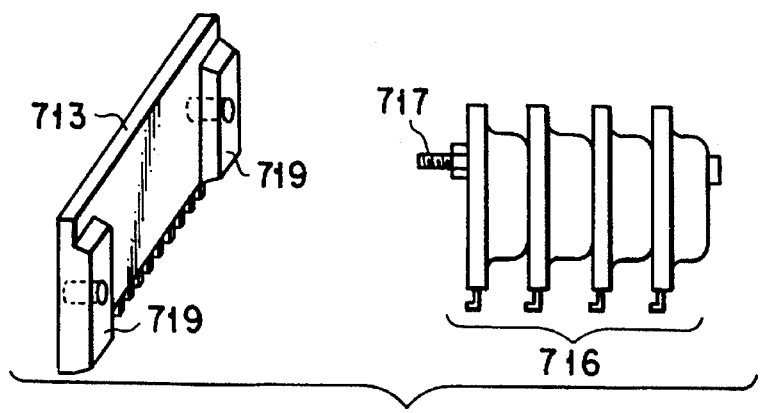

Moreover, instead of post-adhering the spacer, as shown in FIG. 17, cylindrical hollow projections 715 are formed in a semiconductor device 713 at the same time when resin molding is performed, and coupling shafts 717 are passed through these cylindrical hollow projections, thereby a semiconductor device block 716 may formed. Also, as shown in FIG. 18, protrusion portions 719 corresponding to the spacers may be provided at a wide position of the surface of the semiconductor device.

The above explained the seventh embodiment using the holes formed in the semiconductor devices as coupling means. The positions of the holes are not limited to the positions shown in FIGS. 15 to FIG. 18. Any positions may be allowed if the holes can be formed, and the semiconductor devices can be stably coupled to each other.

Figure 19:
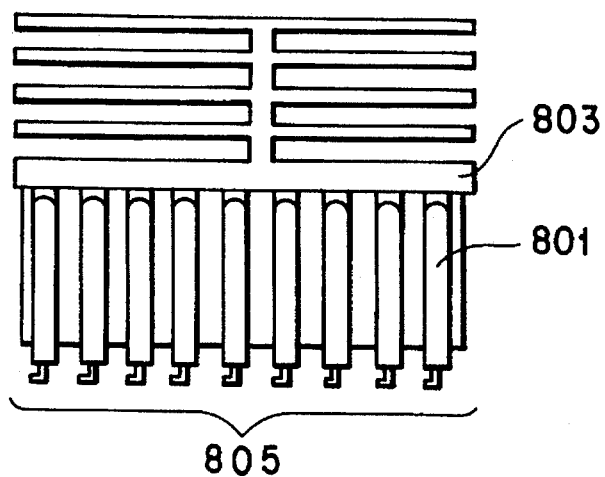
FIG. 19 is a side view showing an eighth embodiment.
Figure 20:
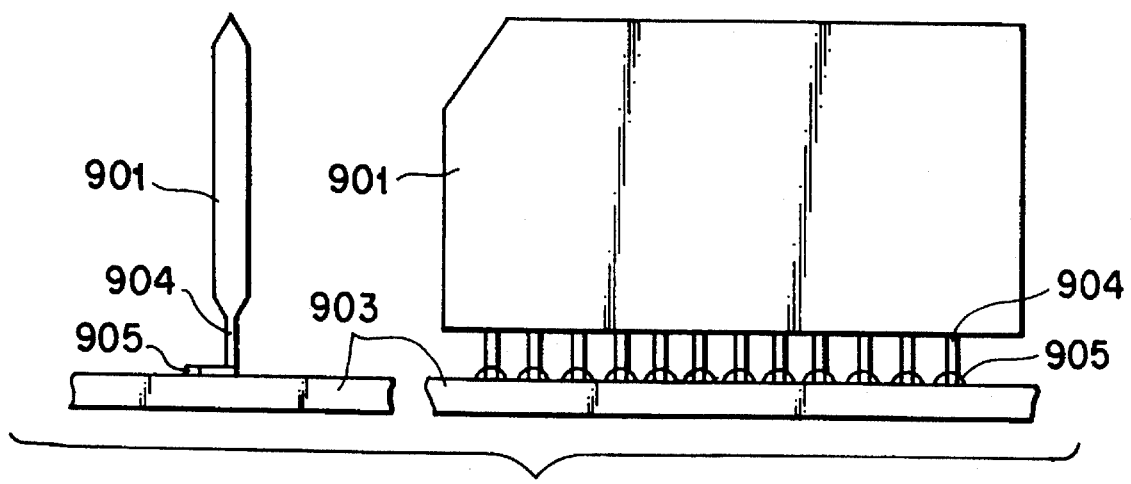
FIGS. 20, 21 and 22 are side and front views showing a prior art.
Figure 21:
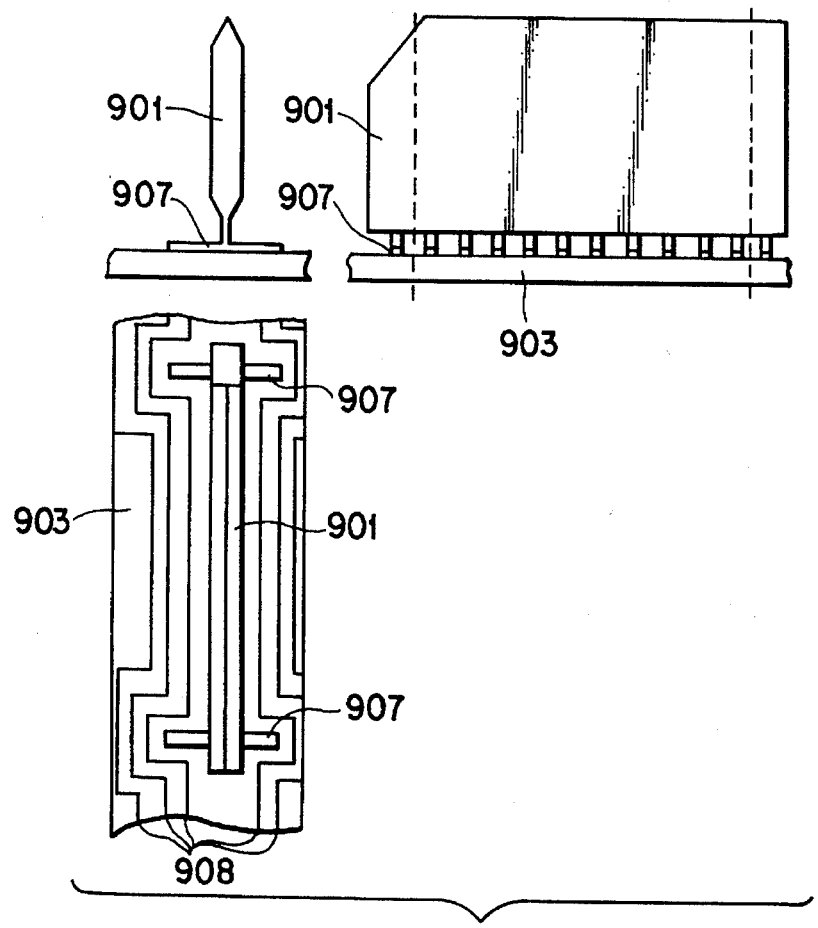
Figure 22:
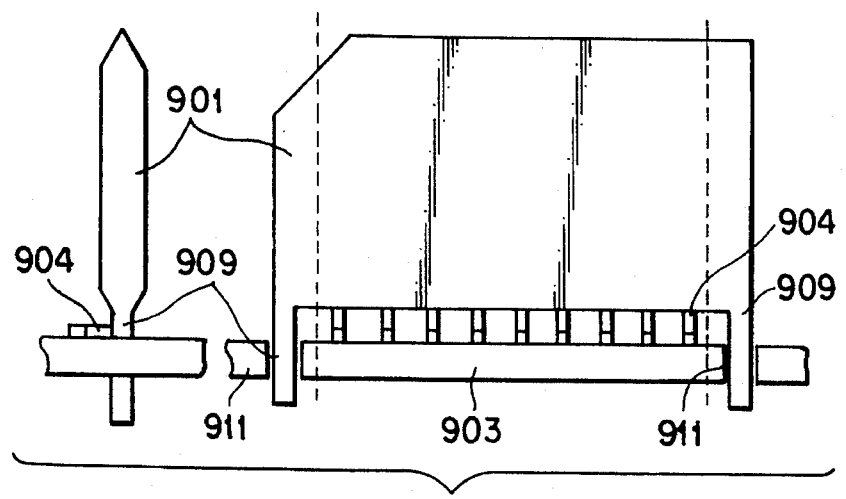

FIG. 19 explains an eighth embodiment in which semiconductor devices are coupled to each other through a heat dissipater, thereby a semiconductor device block is formed.

As shown in FIG. 19, a semiconductor device block 805 is formed by use of a heat dissipater 803, which is arranged such that a plurality of semiconductor devices 801 can be provided. Therefore, heat, which is generated when the semiconductor devices are operated, can be efficiently emitted.

Figure 24:
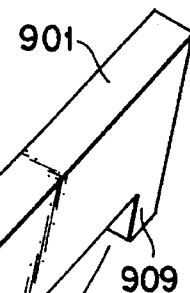
FIG. 24 is a perspective view showing a part of a multi-layered wiring substrate of the prior art.

FIG. 23 is a perspective view showing a part of a multi-layered wiring substrate of the embodiment of the present invention, and FIG. 24 is a perspective view showing a part of a multi-layered wiring substrate of the prior art.

FIG. 24 is an intermediate layer 913 of the multi-layered wiring substrate of the prior art. A wire 912, which does not appear on the surface of the substrate, is shown on the substrate. A semiconductor integrated circuit 901 is attached to the substrate by inserting a projection 909 into an attaching hole 911. Due to this, since the attaching hole is passed through the substrate, the attaching hole 911 is also formed in the intermediate layer 913 of the multi-layered wiring substrate. Due to this, the wire 912 must be formed to detour around the attaching hole 911. This extremely prevents degree of freedom of the wiring, and generates difficulty in the design, and improvement of integration density of the substrate is prevented.

On the other hand, in the embodiment of FIG. 23, the intermediate layer 913 is of the multi-layered wiring substrate of the prior art. The wire 912, which does not appear on the surface of the substrate, is shown on the substrate. In this figure, unlike the prior art, since no attaching hole is used when the semiconductor integrated circuit 901 is mounted on the substrate, the wire 912 is linearly formed on the intermediate layer 913 without any problems. Therefore, there can be realized a multi-layered wiring substrate having high integration density in design of high degree of freedom of the wiring.

The above first to eighth embodiments explained the method for surface-mounting the semiconductor devices of vertical mounting type by use of the semiconductor device block, and the semiconductor devices for forming the semiconductor device.

By use of the above-mentioned method, the semiconductor devices of vertical mounting type are not structured to stand themselves. However, the plurality of semiconductor devices are coupled to each other in parallel, and the semiconductor device block is formed. Thereby, the semiconductor devices stand themselves on the printed board. Therefore, even if soldering paste is melted when reflow is performed, the semiconductor devices do not fall down, and even the semiconductor devices of vertical mounting type can be surface-mounted with high density.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor integrated circuit comprising:

a plate-like major portion formed of resin and having four sides and two major faces;

an "L"-shaped connection terminal projected from one of the four sides of the major portion; and a plurality of connecting projections formed on one of the two major faces, said connecting projections being equal in height, integral with second and third sides of the four sides, perpendicular to said one of the two major faces, and extending along said second and third sides adjacent to said one side from which the connection terminal is projected, wherein said connecting projections are formed so that said semiconductor integrated circuit can be combined with other semiconductor integrated circuits of similar structure to form a block, and said semiconductor integrated circuits are connected together by stacking said connecting projections of said semiconductor integrated circuit on said other semiconductor circuits when at least one connection terminal of each of the semiconductor integrated circuits is bonded to a single substrate.

2. The semiconductor integrated circuit according to claim 1, wherein said connecting projections include:

a first projection perpendicularly projected from said one of the two major faces and having a predetermined width; and a second projection and a third projection both projected perpendicularly from another one of the two major faces and spaced from each other by a distance equal to said predetermined width, said first projection being fitted into a gap defined between second and third projections of a like one of said other semiconductor integrated circuits when the semiconductor integrated circuits are combined into the block and the at least one connection terminal of each of the semiconductor integrated circuits is bonded to said single substrate.

3. The semiconductor integrated circuit according to claim 1, wherein said connecting projections include:

a first projection perpendicularly projected from said one of the two major faces and having a predetermined width; and a second projection projected perpendicularly from another one of the two major faces, said second projection extending along a side adjacent to said one of the four sides from which the connection terminal is projected; and a third projection projected perpendicularly from said another one of the two major faces, said third projection being spaced from the second projection by a distance equal to said predetermined width, said first projection being fitted into a gap defined between second and third projections of a like one of said other semiconductor integrated circuits when the semiconductor integrated circuits are combined into the block and the at least one connection terminal of each of the semiconductor integrated circuits is bonded to said single substrate.

4. The semiconductor integrated circuit according to claim 1, wherein said connecting projections are metal couplers formed on the two major faces, said metal couplers extend along said two sides adjacent to said one of the four sides from which the connection terminal is projected, and are perpendicular to the two major faces, and said metal couplers are coupled to similar metal couplers of at least one of the other semiconductor integrated circuits when the semiconductor integrated circuits are combined into the block and the at least one connection terminal of each of the semiconductor integrated circuits is bonded to said single substrate.

5. A semiconductor integrated circuit comprising:

a plate-like major portion formed of resin and having four sides and two major faces;

an "L"-shaped connection terminal projected from one of the four sides of the major portion; and connecting means formed on one of said two major faces and extending along said two sides adjacent to said one side from which the connection terminal is projected, for connecting to connecting means of other like semiconductor integrated circuits when said semiconductor integrated circuits are combined to form a block and at least connection terminal of each of the semiconductor integrated circuits is bonded to a single substrate, said connecting means in said block being configured for emission of heat at least along the fourth side, wherein said connecting means includes magnetic members embedded in two of four corners of the plate-like major portion.

6. A semiconductor integrated circuit comprising:

a plate-like major portion formed of resin and having four sides and two major faces;

an "L"-shaped connection terminal projected from one of the four sides of the major portion; and connecting means formed on one of said two major faces and extending along said two sides adjacent to said one side from which the connection terminal is projected, for connecting to connecting means of other like semiconductor integrated circuits when said semiconductor integrated circuits are combined to form a block and at least one connection terminal of each of the semiconductor integrated circuits is bonded to a single substrate, said connecting means in said block being configured for emission of heat at least along the fourth side, wherein said connecting means includes magnetic members perpendicularly projected from the two major faces of the major portion, respectively.

7. A semiconductor integrated circuit block comprising:

a plurality of semiconductor integrated circuits, each of said semiconductor integrated circuits including:

(i) a plate-like portion formed of resin and having four sides and two faces; and (ii) an "L"-shaped connection terminal projected from one of the four sides of the plate-like portion, said "L"-shaped connection terminal including a first terminal portion connected to said one of the four sides, and a second terminal portion orthogonally extending from a tip end of the first terminal portion in a direction away from the major portion; and means for coupling the semiconductor integrated circuits together as one body, wherein said coupling means includes:

a first projection perpendicularly projected from one of the two major faces of the plate-like portion and having a predetermined width, said predetermined width being determined in a direction of those two sides adjacent to said one of the four sides from which the connection terminal is projected; and second, third, fourth and fifth projections located at four corners of another one of the two major faces of the plate-like portion, respectively, and being perpendicular to said another one of the two major faces, said second, third, fourth and fifth projections being spaced in said direction by a distance equal to said predetermined width, said first projection being fitted into a gap defined between the second and third projections and into a gap defined between the fourth and fifth projections.

8. A semiconductor integrated circuit block comprising:

a plurality of semiconductor integrated circuits, each of said semiconductor integrated circuits including:

(i) a plate-like portion formed of resin and having four sides and two faces; and (ii) an "L"-shaped connection terminal protected from one of the four sides of the plate-like portion, said "L"-shaped connection terminal including a first terminal portion connected to said one of the four sides, and a second terminal portion orthogonally extending from a tip end of the first terminal portion in a direction away from the major portion; and means for coupling the semiconductor integrated circuits together as one body, wherein said coupling means includes:

a first projection perpendicularly projected from one of the two major faces of the plate-like portion and having a predetermined width in a direction of said one of the four sides from which the connection terminal is projected; and second and third projections formed on another one of the two major faces of the major portion and being perpendicular to said another one of the two major faces, said second and third projections being located at one of the two major faces and extending along those two sides adjacent to said one of the four sides from which the connection terminal is projected and being spaced by a distance equal to said predetermined width in a direction of said one of the four sides from which the connection terminal is projected, said first projection being fitted into a gap defined between the second and third projections.

* * * * *

UNITED STATES PATENT AND TRADEMARK OFFICE
CERTIFICATE OF CORRECTION

PATENT NO. : 5,616,962
DATED : April 01, 1997
INVENTOR(S) : Toshimitsu ISHIKAWA et al.

It is certified that error appears in the above-indentified patent and that said Letters Patent is hereby corrected as shown below:

Claim 8, Col. 10, line 26, change "protected" to --projected--.

Signed and Sealed this

Twenty-first Day of October 1997

Attest:

BRUCE LEHMAN

Attesting Officer        Commissioner of Patents and Trademarks